United States Patent
Pagani

(10) Patent No.: US 9,874,586 B2
(45) Date of Patent: Jan. 23, 2018

(54) ELECTROMAGNETIC SHIELD FOR TESTING INTEGRATED CIRCUITS

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate, Brianza (IT)

( * ) Notice: Subject to any disclaimer, the term of this patent is extended or adjusted under 35 U.S.C. 154(b) by 121 days.

(21) Appl. No.: 14/533,526

(22) Filed: Nov. 5, 2014

(65) Prior Publication Data

US 2015/0054538 A1 Feb. 26, 2015

Related U.S. Application Data

(62) Division of application No. 12/851,680, filed on Aug. 6, 2010, now Pat. No. 8,907,693.

(30) Foreign Application Priority Data

Aug. 28, 2009 (IT) .............. MI2009A1511

(51) Int. Cl.
*G01R 1/18* (2006.01)
*G01R 31/28* (2006.01)
*G01R 1/073* (2006.01)
*G01R 1/067* (2006.01)

(52) U.S. Cl.
CPC .......... *G01R 1/18* (2013.01); *G01R 1/07307* (2013.01); *G01R 31/2884* (2013.01); *G01R 31/2886* (2013.01); *G01R 1/06772* (2013.01)

(58) Field of Classification Search
None
See application file for complete search history.

(56) References Cited

U.S. PATENT DOCUMENTS

| 4,697,143 A | 9/1987 | Lockwood et al. |
| 5,373,231 A | 12/1994 | Boll et al. |
| 6,727,716 B1 * | 4/2004 | Sharif ............... G01R 1/06738 324/750.27 |
| 6,897,663 B1 | 5/2005 | Conn |

(Continued)

FOREIGN PATENT DOCUMENTS

| JP | 11030630 | 2/1999 |
| WO | WO-2004001807 A2 | 12/2003 |

OTHER PUBLICATIONS

IT Search Report for IT MI2009A001511 dated Apr. 21, 2010 (3 pages).

*Primary Examiner* — Jermele M Hollington
(74) *Attorney, Agent, or Firm* — Gardere Wynn Sewell LLP

(57) ABSTRACT

A probe card includes a number probes. Each probe is adapted to contact a corresponding terminal of a circuit integrated in at least one die of a semiconductor material wafer during a test phase of the wafer. The probes include at least one probe adapted to provide and/or receive a radio frequency test signal to/from the corresponding terminal during the test phase. The probe card further includes at least one electromagnetic shield structure corresponding to the at least one probe adapted to provide and/or receive the radio frequency test signal for the at least partial shielding of an electromagnetic field irradiated by such at least one probe adapted to provide and/or receive the radio frequency test signal.

26 Claims, 11 Drawing Sheets

(56) References Cited

U.S. PATENT DOCUMENTS

| | | | |
|---|---|---|---|
| 7,026,646 B2 | 4/2006 | Cowles et al. | |
| 7,126,359 B2 | 10/2006 | Huang et al. | |
| 7,173,444 B2 | 2/2007 | Pourkeramati et al. | |
| 7,372,170 B2 | 5/2008 | Pendse | |
| 8,089,295 B2 | 1/2012 | Marley et al. | |
| 8,907,693 B2 * | 12/2014 | Pagani | G01R 1/07307 324/756.03 |
| 2002/0001863 A1 | 1/2002 | Park | |
| 2004/0043653 A1 | 3/2004 | Feldman | |
| 2006/0043992 A1 | 3/2006 | Jimi | |
| 2008/0007927 A1 | 1/2008 | Ito et al. | |
| 2008/0017856 A1 * | 1/2008 | Fujino | G01R 31/2884 257/48 |
| 2008/0116917 A1 * | 5/2008 | Kanev | G01R 31/2889 324/750.19 |
| 2009/0075428 A1 * | 3/2009 | Tang | H01L 21/561 438/114 |
| 2010/0171436 A1 * | 7/2010 | DeVincentis | H01J 65/044 315/248 |
| 2013/0015870 A1 * | 1/2013 | Nickel | G01R 31/2822 324/754.03 |
| 2013/0078745 A1 | 3/2013 | Wang et al. | |
| 2014/0167799 A1 * | 6/2014 | Wang | H02H 9/046 324/750.14 |

* cited by examiner

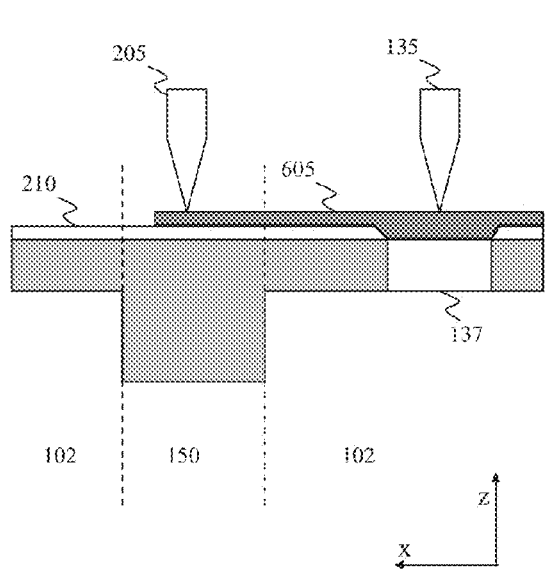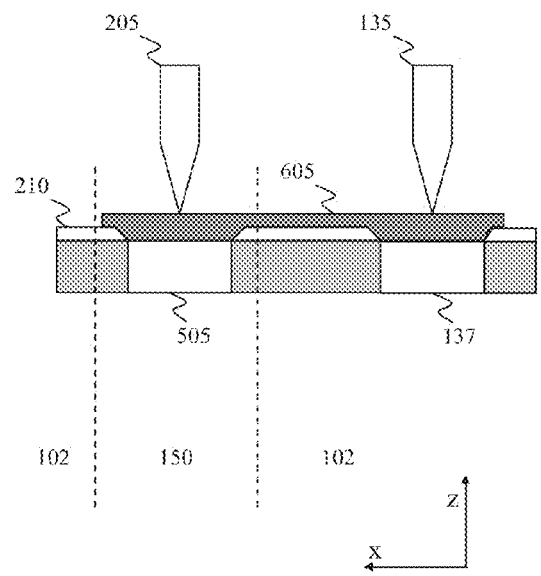
FIG. 7A  FIG. 7B
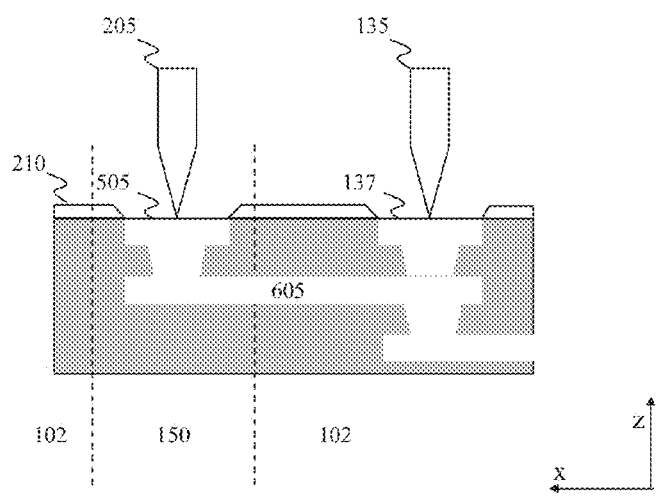
FIG. 7C

ELECTROMAGNETIC SHIELD FOR TESTING INTEGRATED CIRCUITS

CROSS-REFERENCE TO RELATED APPLICATIONS

This application is a divisional of U.S. application for patent Ser. No. 12/851,680 filed Aug. 6, 2010, which claims priority to Italian Patent Application No. MI2009A001511, filed Aug. 28, 2009, which applications are incorporated herein by reference in their entirety.

TECHNICAL FIELD

An embodiment relates to systems for testing Integrated Circuits (IC), and particularly an embodiment relates to probe cards for testing IC's through Radio Frequency (RF) signals.

BACKGROUND

Integrated Circuits (ICs) are typically manufactured in the form of dies on a wafer of semiconductor material. Particularly, after the manufacturing operations, the semiconductor material wafer is subdivided into dies, each one including a respective IC.

Before being packaged and sent to customers, and before being installed in complex electronic systems, the ICs are tested for evaluating their functionality, and particularly for assuring that they are not defective. During the test, information may be retrieved regarding global or local physical faults (such as, for example, the presence of undesired short circuits and breaks) and more generally regarding the IC operation on each tested die (for example, checking the waveforms of one or more output signals generated by the IC on each tested die). In this way, the subsequent phases of the manufacturing process (such as for example the linking of the bond wires, the packaging, and the final test) may be carried out only by the dies which have met predetermined results.

According to a known test technique, the dies including the ICs are tested before the semiconductor material wafer is subdivided. A test performed at wafer-level is denoted "wafer sort" or Electrical Wafer Sort (EWS).

In order to perform the test, a test apparatus is employed, which comprises a tester coupled to the semiconductor material wafer including the dies to be tested by means of a proper probe card.

The tester is adapted to manage signals to be used for performing the test; in the following, such signals will be denoted "test signals". The test signals include test stimula (such as, commands, memory location addresses, data to be written in the memory device) generated by the tester and sent to each die to be tested through the probe card, and test response signals, which are generated by the ICs integrated in each die during the test phase in response to the received test stimula. The test response signals are sent by the IC integrated in each die to the tester through the probe card; such signals are then processed by the tester in order to obtain an indication regarding the correct (or incorrect) operation of the ICs integrated in the dies.

In order to allow the exchange of the test signals, the probe card is electrically coupled to the dies by means of particular probes. Particularly, the probe card consists of a Printed Circuit Board (PCB) connected to a plurality of mechanical probes adapted to physically contact input/output contact pads included in the die to be tested.

Each input/output contact pad is formed by an enlarged metallization region surrounded and possibly partially covered by a passivation layer.

During the test operations, the contact pad is etched or scratched by the mechanical action exerted by the probe's tip to establish a good electrical connection. In this way, it is possible to allow the test signals to be exchanged between the tester and the die to be tested.

A first category of known probe card comprises the probe cards provided with so-called cantilever probes. Such probes comprise a ring (for example, made of aluminum, special alloys, or ceramic material) which is connected to an epossidic support. Such epossidic support is adapted to support a plurality of test elements comprising elastic cantilever probes, formed by an alloy having good electrical and mechanical properties. Particularly, each cantilever probe includes a beam having a first end connected to the epossidic support and a second end including a tip, which in use it is intended to be forced against a contact pad of the die including the IC to be tested.

As an alternative to the probe cards including cantilever probes, it is possible to provide substantially vertical probes comprising conductive wires which pass through holes formed in a head of the probe card. In detail, the head of the probe card includes an upper guide plate stacked on a lower guide plate. Each probe has a tip that protrudes from the lower guide plate and it is adapted to electrically contact the corresponding contact pad of the die to be tested. A contact interface known as "space transformer" is connected to the upper guide plate and is adapted to electrically couple the probes to the printed circuit board in such a way to allow the signal exchange between the tester and the die to be tested.

A further type of probe card provides for the use of probes of the microelectromechanical type (known as MicroElectroMechanical System probes, or MEMS probes). With the term of MEMS probe it is intended a probe that has been manufactured through lithographic processes similar to those used for manufacturing the ICs. Thanks to the use of such lithographic processes, it is possible to manufacture a great number of MEMS probes having sufficiently homogeneous structural and electrical features in a manner that is relatively cheap.

Among the various known topologies of MEMS probes for the use in the integrated-circuits probe card field, one of the most widespread is formed by an elastic metallic beam having an end that is connected to a substrate (for example, made of a semiconductor or ceramic material) by means of one or more conductive-material support pillars, and the other end to a protruding tip adapted to electrically contact the contact pads of the die to be tested. The substrate is provided with proper conductive tracks connected to the support pillars. In this way, the exchange of test signals between the generic die and the tester by means of a MEMS probe may be carried out through a conductive path comprising the tip, the elastic beam, the support pillars and the conductive tracks formed in the substrate.

Further equivalent types of MEMS probes are known such as for example probes formed by a single metallic beam properly shaped which is directly connected to the substrate, probes formed by a stringy elastic element connected to the substrate and provided with a laminar tip, probes comprising silicon beams, and probes formed by thin curved foils of a conductive material.

If the ICs formed on the semiconductor material wafer comprise circuits intended to be exploited at the Radio Frequencies—in jargon, RF circuits—the testing provides for the use of Radio Frequency test signals—briefly, RF signals. For this purpose, the tester is capable of generating and acquiring RF signals, and the probe card is capable of providing and retrieving such RF signals to/from the ICs to be tested through the probes.

However, it is known that the management of RF signals may be critical, and may require one to employ a higher level of care with respect to that required for managing more slowly varying signals, i.e., low-frequency signals. Indeed, considering the generic conductive path of the probe card adapted to convey test signals from the tester to the probes contacting the ICs to be tested (and vice versa), such path, in the case of relatively low frequency test signals, may be assimilated to a short circuit, while, in the case of RF test signals, the same conductive path may behave as a transmission line. Consequently, in order to test RF circuits, one accurately designs the probe card, taking into account all the electromagnetic issues due to the presence of the transmission lines. For example, the probe cards presently employed for testing ICs by means of RF test signals comprise a plurality of proper expedients, such as coaxial cables and connectors, wide ground planes for the electromagnetic shielding, and so on.

However, although such solutions may be capable of efficiently shielding the transmission lines formed on the probe card, the correct carrying out of the test operations may not reach a successful conclusion because of the crosstalk phenomena that would occur between the probes connected to the probe card. Particularly, each probe, when in the path of an RF signal, behaves as an antenna irradiating electromagnetic waves in the surrounding area; such irradiated electromagnetic field may be picked up by the near probes of the probe card, negatively interfering with the successful conclusion of the test operations.

Among the solutions presently employed for resolving such problem, it is known to reduce the effects due to the crosstalk phenomenon by means of a proper design of the probes (regardless of the type) to diminish the irradiated electromagnetic field. For example, according to a known solution the electromagnetic field irradiated by a probe is reduced by diminishing as much as possible the length of the probe itself; however, by employing a solution of such type, it is possible to incur in drawbacks of other types, since a probe card equipped with probes that are too short may cause problems during the portion of the test phase which provides for the alignment of the probes to the pads of the IC to be tested.

In view of the above, when ICs formed on a semiconductor material wafer are to be tested by means of RF test signals, presently it may be preferred to test a single IC at a time, so as to avoid the arise of crosstalk phenomena among probes directed to contact different ICs. However, employing a solution of such type jeopardizes the possibility of testing more than one IC at the same time, consequently increasing the cost of the test operations in a non-negligible way compared to parallel testing.

SUMMARY

An embodiment overcomes the previously mentioned drawbacks.

An embodiment relates to a probe card. The probe card comprises a plurality of probes. Each probe is adapted to contact a corresponding terminal of a circuit integrated in at least one die of a semiconductor material wafer during a test phase of the wafer. Said plurality of probes includes at least one probe adapted to provide and/or receive a radio frequency test signal to/from the corresponding terminal. Said probe card comprises at least one electromagnetic shield structure corresponding to the at least one probe adapted to provide and/or receive the radio frequency test signal for the at least partial shielding of an electromagnetic field irradiated by such at least one probe adapted to provide and/or receive the radio frequency test signal.

An embodiment regards the use of a probe card.

BRIEF DESCRIPTION OF THE DRAWINGS

One or more embodiments of the invention, and features and advantages thereof, will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein.

FIGS. 2A, 2B, 2C, 3, 4A, 4B, 5, 6, 7A, 7B, 7C, 8A, 8B, 9, 10A, 10B, 11, 12A, 12B, 13, 14A, 14B and 14C show electromagnetic shield structures according to various embodiments.

DETAILED DESCRIPTION

Figure 1:
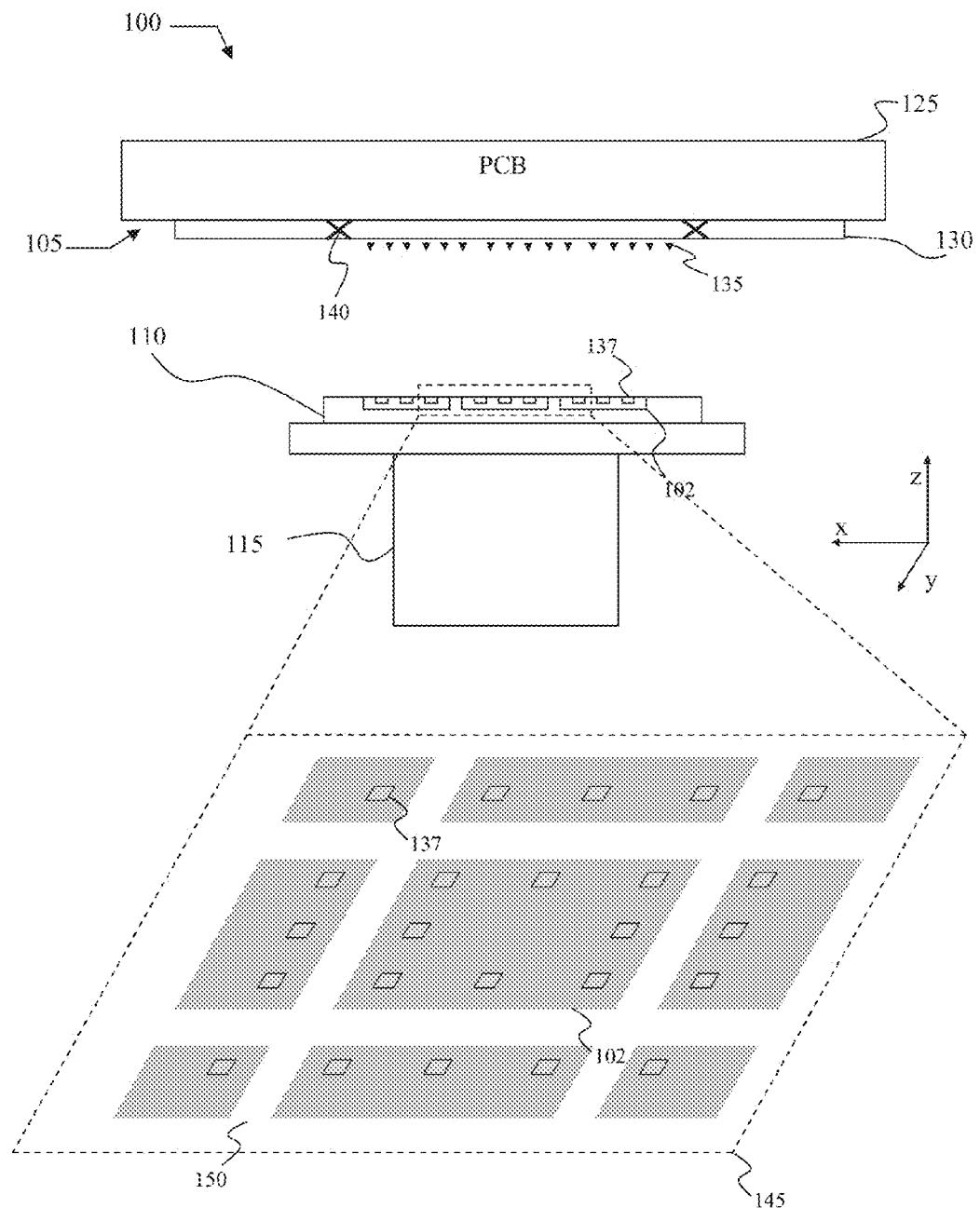
FIG. 1 schematically shows a sectional view of a portion of an embodiment of a piece of test equipment comprising a probe card for the electrical coupling with a semiconductor wafer to be tested.

With reference to FIG. 1, it is schematically illustrated a sectional view of an embodiment of a portion of a piece of test equipment 100 comprising a probe card 105 adapted to electrically couple Integrated Circuits (IC) in dies 102 of a semiconductor material wafer 110 to be tested.

The wafer 110 is located on a support 115 capable of being moved along the three orthogonal directions "x", "y" and "z" schematically indicated in figure; the support 115 may be further rotated and inclined. Once the semiconductor wafer 110 has been placed on the support 115, the latter is moved in such a way to bring the wafer 110 to be tested in contact with the probe card 105.

In the example at issue, the probe card 105 includes a printed circuit board 125 connected to a (e.g., semiconductor or ceramic) substrate 130. The substrate 130 supports a plurality of probes 135, for example probes of the MEMS type, adapted to electrically contact pads 137 formed on the dies 102 of the wafer 110 to be tested.

The printed circuit board 125 comprises the circuits required for the communication between a tester (not shown in the figure) and the wafer 110 to be tested. For example, the printed circuit board 125 comprises circuits for processing data/signals controlling the whole operation of the probe card 105, and that may operate under the control of a software stored in a memory unit (for example, one or more memories included in the printed circuit board 125).

Although in the considered example the probes 135 are supported by a substrate 130, in another embodiment the probes 135 may be directly connected to the printed circuit board 125.

Particular or "fiducial" marks 140 may be provided on the printed circuit board 125 or on the substrate 130 for allowing the correct alignment between the probe card 105 and the wafer 110.

The probes 135 are arranged on the substrate 130 in such a way each one of them is adapted to establish a communication relationship with a respective pad 137 of a die 102 of the wafer 110 to be tested. In this way, the probe card 105 is capable of providing the test signals generated by the tester to the circuits integrated in the dies 102, and the tester is capable of receiving corresponding signals generated by the circuits integrated in the dies 102 in response to such test signals.

A particular of the wafer 110 surface is shown in the figure with the reference 145, and particularly a portion of the wafer 110 surface corresponding to a generic die 102. As can be seen in the figure, each die 102 is arranged on the wafer 110 surface at a predetermined distance from the adjacent die 102, in such a way to form semiconductor material separation lines (in jargon, "scribe lines"), identified in figure with the generic reference 150. At the end of the manufacturing process and after the test has been completed, the die 102 are separated from the wafer 110 by means of the action of a diamonded saw or a laser along such scribe lines 150.

According to an embodiment, the testing of the circuits integrated in the dies 102 by means of RF test signals may be carried out in parallel on more than one die 102 at the same time since the probe card 105 is provided with electromagnetic shield structures adapted to shield (or at least reduce) the electromagnetic field irradiated by the probes 135.

According to an embodiment, such electromagnetic shield structures are proper probes—referred to as shielding probes and identified with the generic reference 205—biased to a constant potential, such as the ground potential, through a proper transmission line. The shielding probes 205 may be of the same type of the probes 135 used for providing and/or receiving the test signals to/from the die 102, and are connected to the probe card 105 in a very similar way (in the example at issue, supported by the substrate 130). Unlike the probes 135 used for the test signals, which are arranged on the substrate 130 in such a way that each one of them is adapted to establish a communication relationship with a respective contact pad 137 of a die 102 of the wafer 110 to be tested, the shielding probes 205 are arranged on the substrate 130 for forming electromagnetic shields adapted to shield the electromagnetic shield irradiated by the probes 135 from RF test signals irradiated by probes or other dies.

Figure 2A:
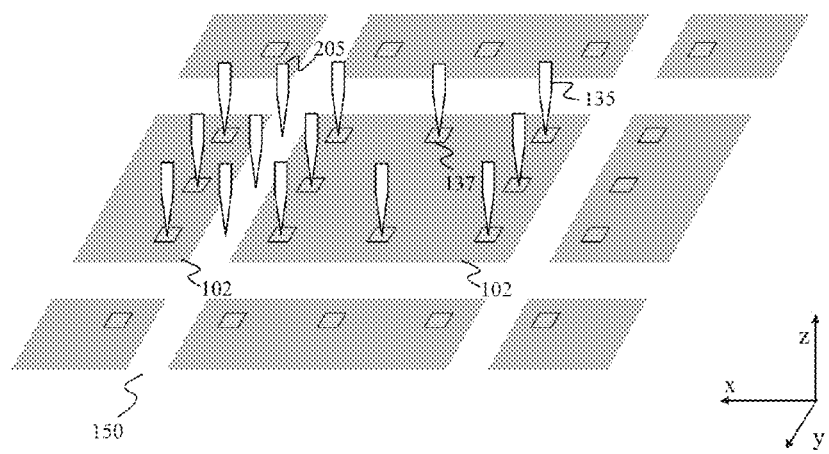

In this way, as illustrated in FIG. 2A, according to an embodiment it is possible to shield two adjacent die 102 on the wafer 110 reducing as much as possible the crosstalk phenomena occurrences among probes 135 adapted to contact the pads 137 of the two die 102 for providing and/or receiving RF test signals. Particularly, in this case the shielding is obtained by means of an array of shielding probes 205 arranged on the substrate 130 in such a way that each shielding probe 205 belonging to such array is positioned in correspondence to the scribe line 150 which divides the two adjacent dies 102 when the wafer 110 is brought in contact with the probe card 105 during the test.

Biasing such shielding probes 205 with a direct voltage such as the ground voltage (or ground potential), the propagation of the electric field irradiated by a probe 135 (crossed by an RF test signal) contacting a pad 137 of one of the two dies 102 toward the probes 135 contacting the pads 137 of the other die 102 is strongly reduced. In this way it is possible to perform the test in parallel, providing RF test signals to circuits integrated in both the adjacent dies 102, without having to incur a crosstalk phenomena capable of compromising the successful conclusion of the test.

According to an embodiment, the voltages for biasing the shielding probes 205 are provided by the tester by means of proper transmission lines on the probe card 105, like the test signals.

In order to correctly operate as an electromagnetic shield toward the electromagnetic fields generated by the passage of an RF signal in a probe 135, it is not necessarily that the shielding probes 205 are biased with a constant potential. Indeed, it is possible to obtain an analog shielding effect by biasing the shielding probes 205 by means of a potential whose value varies at a frequency that is sufficiently lower than the frequency of the RF signal that has generated the field to be shielded.

Moreover, it is not necessary that all the shielding probes are biased to the same potential value; indeed, similar considerations apply to the case in which each shielding probe 205, or each group of shielding probes 205, is biased by means of a different voltage value.

Figures 2B, 2C:
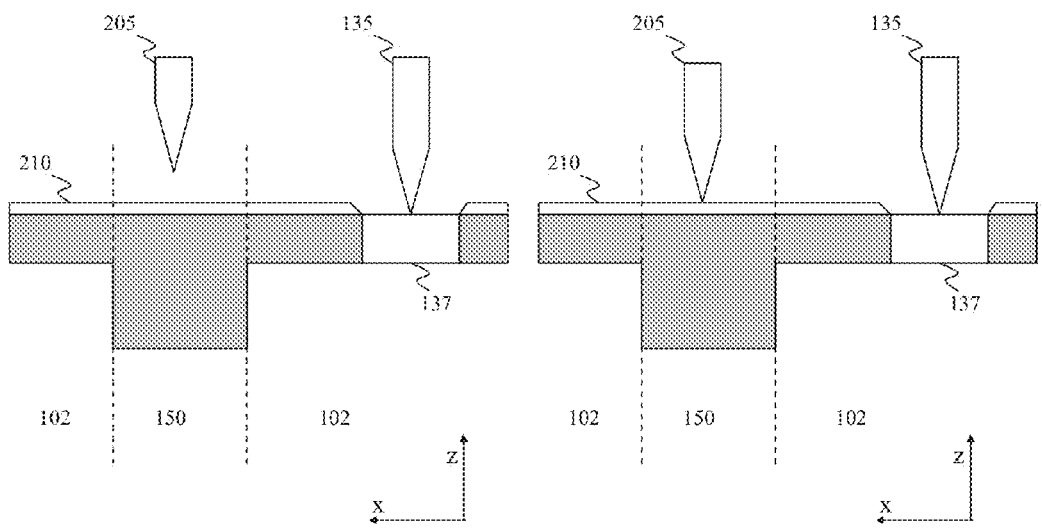

According to an embodiment illustrated in FIG. 2B, the length of the shielding probes 205 is such to leave a space between the tip of each shielding probe 205 and the surface of the underlying scribe line 150 (more in particular, the passivation layer 210 located over the surface) when the probe card 105 is placed in contact with the wafer 110 during the test. However such solution may not be advisable, since usually it may be preferred to form the probe cards 105 in such a way that all the probes are planar to each other.

For this purpose, in an embodiment, each shielding probe 205 may have a length that is sufficient to establish a physical contact between the tip of the shielding probe 205 and the passivation layer 210 over the surface of the scribe line 150 during the testing, as illustrated in FIG. 2C. Even if in this way it is possible to damage the scribe line 150 because of the direct mechanical contact between the tip of the shielding probe 205 and the scribe line 150, the correct operation of the circuits integrated in the die 102 is not affected, since the scribe lines 150 are destined to being subjected to the cutting operations after the testing operations.

Figure 3:
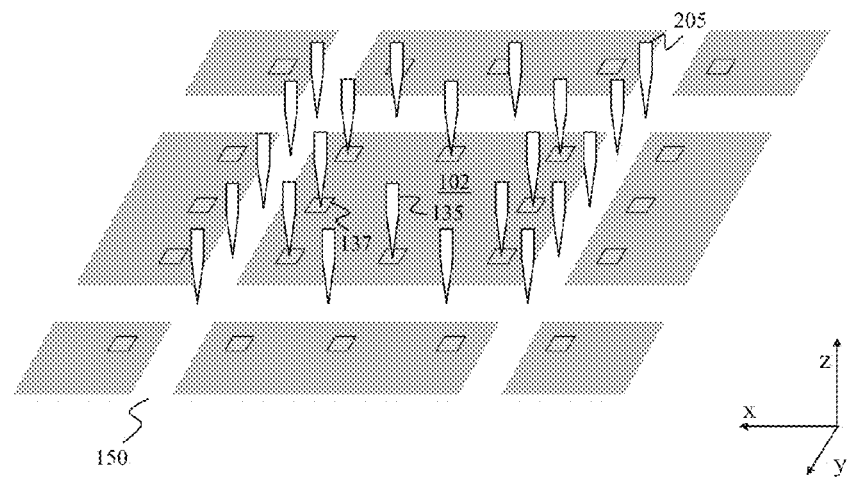

According to an embodiment, in order to shield the probes 135 adapted to enter in communication with the contact pads 137 of a die 102 from the electromagnetic fields irradiated by probes 135 adapted to enter in communication with the contact pads 137 of one or more of the dies 102 adjacent to such die 102 in the wafer 110, during the testing each side of such die 102 is surrounded by a respective array of shielding probes 205, as illustrated in FIG. 3.

Figure 4A:
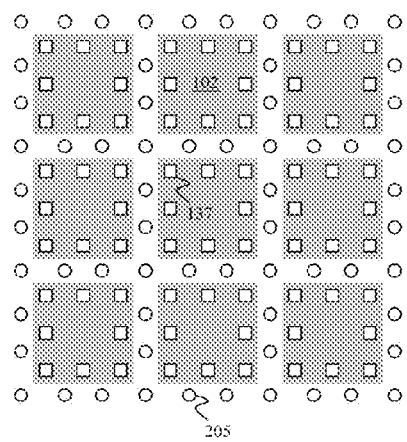

As illustrated in FIG. 4A, by arranging the shielding probes 205 on the substrate 130 of the probe card 105 according to matrix arrangement corresponding to the scribe lines 150 of the wafer 110 to be tested, it is possible to surround completely each die 102 of the wafer 110 with shielding probes 205, and to perform the test on all the dies 102 of the wafer 110 at the same time.

Figure 4B:
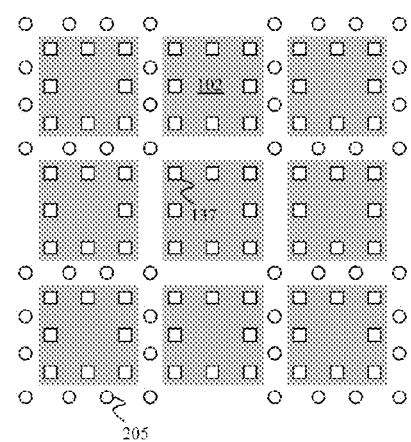

According to a further embodiment, it is possible to provide for an intermediate solution, in which the shielding probes 205 are arranged on the substrate 130 of the probe card 105 in such a way to surround only a subset of the die 102 of the wafer 110 at the same time. This embodiment implies a reduction of the test's degree of parallelism (the die 102 are not tested all at the same time) but allows to simplify the structure of the probe card 105, providing for a lower number of shielding probes 205. Moreover, if the shielding probes 205 are arranged on the substrate 130 in such a way to surround die 102 that are not adjacent to each other (as it is illustrated in FIG. 4B), it is possible to further reduce the crosstalk phenomenon.

In some cases, it is possible that the wafer 110 is provided with contact pads directly located within the scribe lines 150. Unlike the contact pads 137 formed within the dies 102, some of the contact pads formed in the scribe lines 150 may be only exploited during the test—for receiving and transmitting from/to the probes 135 the test signals—and not during the standard operation of the circuits integrated in the die 102. If during the test such contact pads located within the scribe lines 150 are coupled with probes 135 conveying signals whose potential varies at a frequency that is sufficiently lower than the frequency of the RF signals, such probes 135 may contribute to the formation of the electromagnetic shields, acting both as a normal test probe and as a shielding probe. Alternatively, such probes as well may be biased in an analogous way as previously recited.

Figure 5:
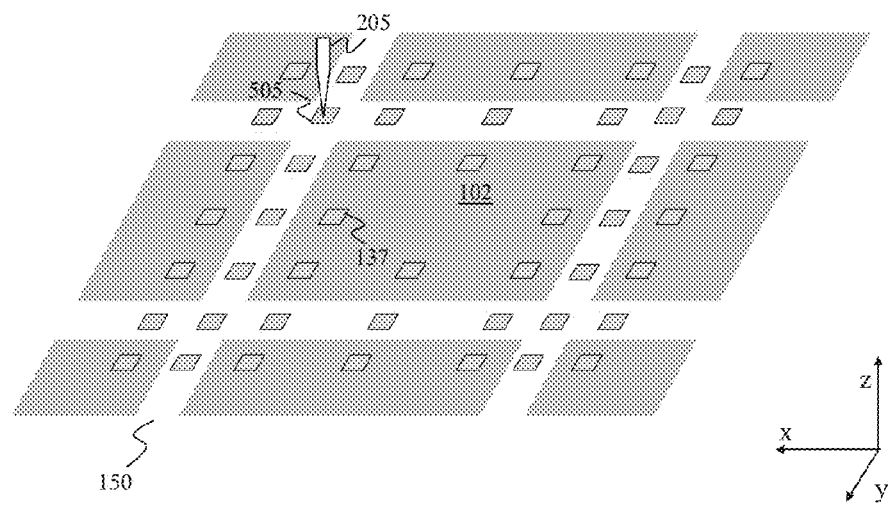

According to an embodiment, the scribe lines 150 are provided with contact pads that are specifically destined to enter in contact with a respective shielding probe 205 during the test. Such contact pads, denoted shielding contact pads, are identified in FIG. 5 with the numeral reference 505. Thanks to the presence of such shielding contact pads 505, possible scribe line 150 damages may be prevented, since a final customer interested in the direct acquiring of the wafer 110 may request substantially undamaged scribe lines 150.

In all the previously described embodiments, the shielding probes 205 are biased by the tester through the probe card 105. As a consequence, the probe card 105 exhibits an additional complexity level, given by the need to distribute the various biasing voltages to the shielding probes 205; the higher the number of shielding probes 205 arranged on the substrate 130, typically the more complex the probe card 105.

According to an embodiment, this problem may be resolved by connecting multiple shielding contact pads 505 to each other through a conductive connection track, functioning as a transmission line, which lies in the space of the scribe lines 150. In this way it is possible to leave floating from an electrical point of view one or more shielding probes 205 of the probe card 105, and bias them by exploiting the conductive connection line, thus simplifying the structure of the probe card 105.

Figure 6:
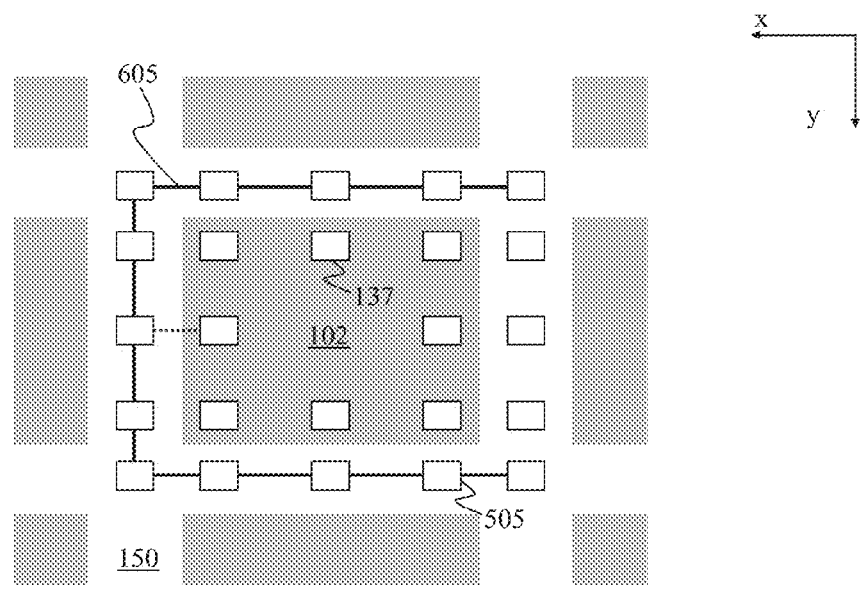

For example, according to an embodiment described in FIG. 6, at least one die 102 is surrounded by shielding contact pads 505 on each side (i.e., in the scribe line portions 150 extending adjacent to the die); a portion of such shielding contact pads 505 (in the example at issue, corresponding to three sides of the die 102) is connected to a same conductive connection line, identified with the reference 605. One of the shielding contact pads 505 linked to the connection line 605 is further linked to a contact pad 137 within the die 102 (through a link that is considered to be part of such connection line 605, and identified in FIG. 6 with a dotted line) adapted to be contacted during the testing by a probe 135 that provides a constant (such as the ground potential) or a slowly variable potential. In this way, such potential may propagate along the connection line 605, and bias all the shielding probes 205 which are in contact with the shielding contact pads 505 linked to such connection line 605. As a consequence, it is not required to bias the shielding probes 205 with the tester through the probe card 105. The shielding probes 205 may thus be left floating from the electrical point of view in the probe card 105, since their biasing through the tester is no longer required. As previously mentioned, some contact pads located in the scribe lines 105 may be exploited during the test phase for receiving and/or providing test signals; in this case, such pads are not connected to the connection line 605.

Examples of connection line 605 and shielding contact pad 505 according to embodiments will be disclosed in the following figures; such figures are sectional views of a portion of the wafer 110 during the test operations, showing a generic shielding probe 205 and the probe 135 adapted to contact the contact pad 137 of the die 102 which provides the constant or slowly variable potential used for biasing the connection line 605.

Particularly, according to embodiments illustrated in FIG. 7A, both the connection line 605 and the shielding connection pad 505 are directly formed over the passivation layer 210, with the connection line 605 implemented by means of a metallic material line.

According to an embodiment illustrated in FIG. 7B, the shielding contact pad 505 is implemented in the same way as the contact pads 137, but is directly generated in the scribe line 150.

According to the embodiment illustrated in FIG. 7C, the connection line 605 is generated by means of a metallic conductive layer under the wafer 110 surface, using for example one of the "metal lines" used for forming conductive tracks within the integrated circuits of the die 102 which crosses the seal ring (not illustrated in figure) surrounding such die 102.

Without descending into exceedingly specific details, the connection line 605 may be formed over the passivation layer 210, and at the same time the linking between such connection line 605 and the contact pad 137 of the die 102 that provides the constant or slowly variable potential may be formed by means of a metallic conductive layer under the wafer 110 surface; vice versa, the connection line 605 may be formed under the wafer 110 surface while the linking between such connection line 605 and the contact pad 137 of the die 102 providing the constant or slowly variable potential may be formed over the passivation layer 210.

Figure 8A:
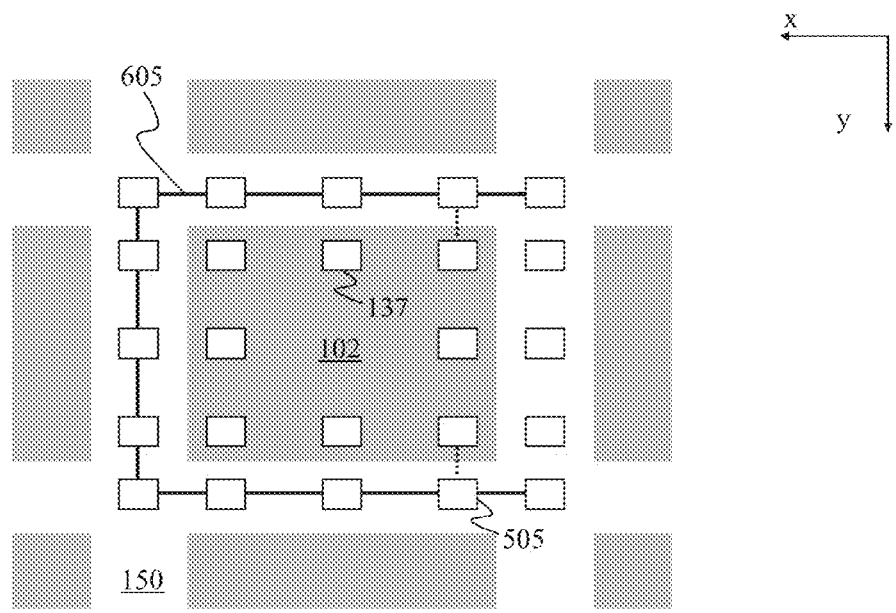
Figure 8B:
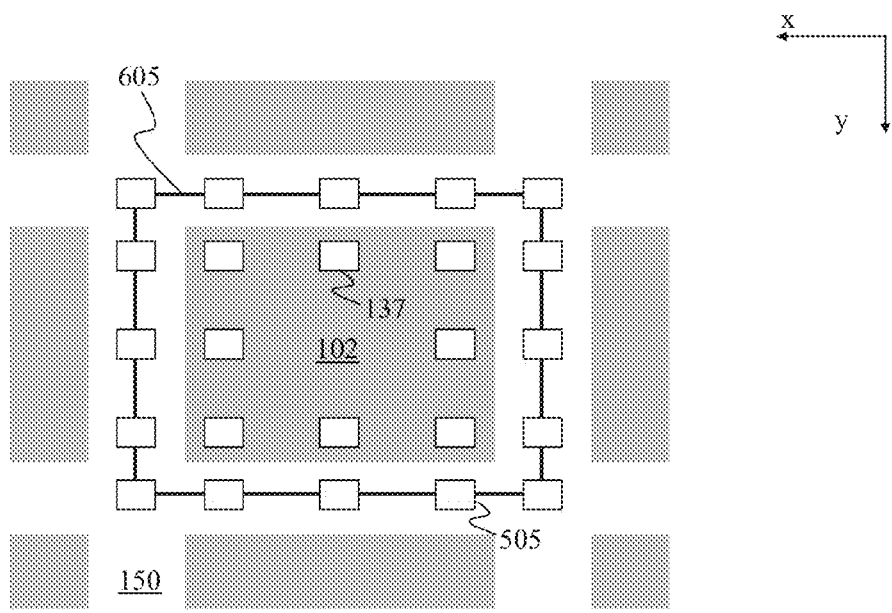

Although reference has been made to an open loop connection line 605 adapted to be biased by means of the linking to a single contact pad 137 of the die 102, similar considerations apply to the case in which such connection line 605 is linked to more than one contact pad 137 of the die 102 (for example to two pads, as illustrated in FIG. 8A) and/or the connection line 605 is of the closed loop type (as illustrated in FIG. 8B). In this case, the constant or slowly variable potential used to bias the connection line 605 may be fed through at least one shielding probe 205. The ring formed by the connection line 605 may be possibly provided with one or more interruptions for the purpose of avoiding the formation of a closed path capable of causing the passage of a current.

Figure 9:
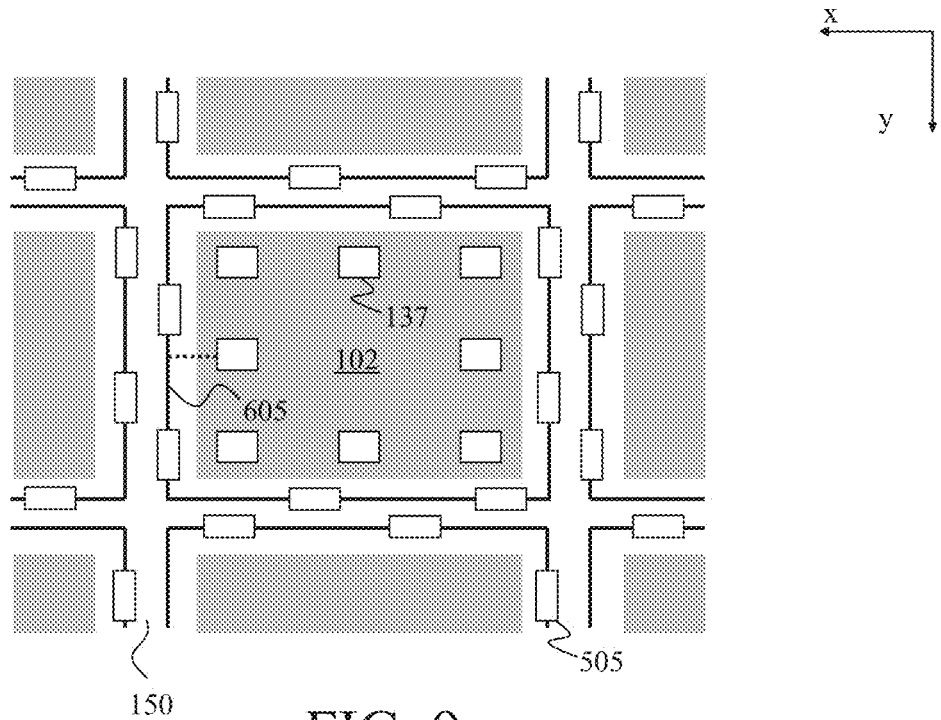

FIG. 9 is a top view of a portion of the wafer 110 surface in which the connection lines 605 and the shielding contact pads 505 corresponding to more dies 102 are shown, in the case in which each contact line 605 is of the closed loop type.

Figure 10A:
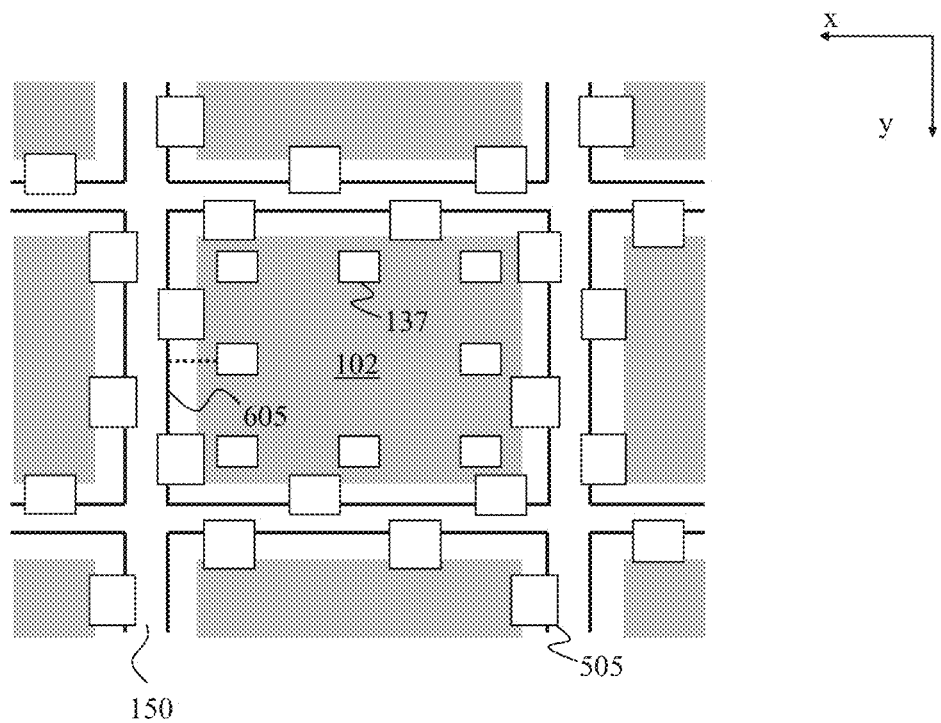
Figure 10B:
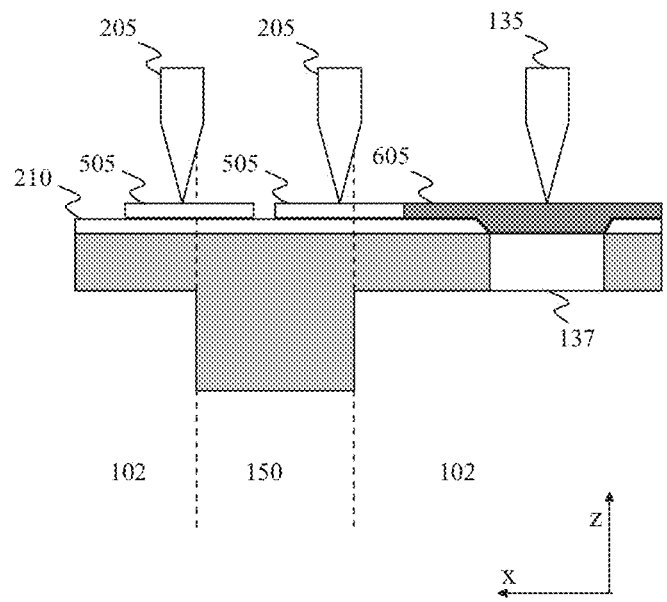

According to an alternative embodiment illustrated in FIG. 10A and FIG. 10B, the shielding contact pads 505 are arranged on the wafer 110 partially within the area of the die 102, and partially over the scribe line 150.

Figure 11:
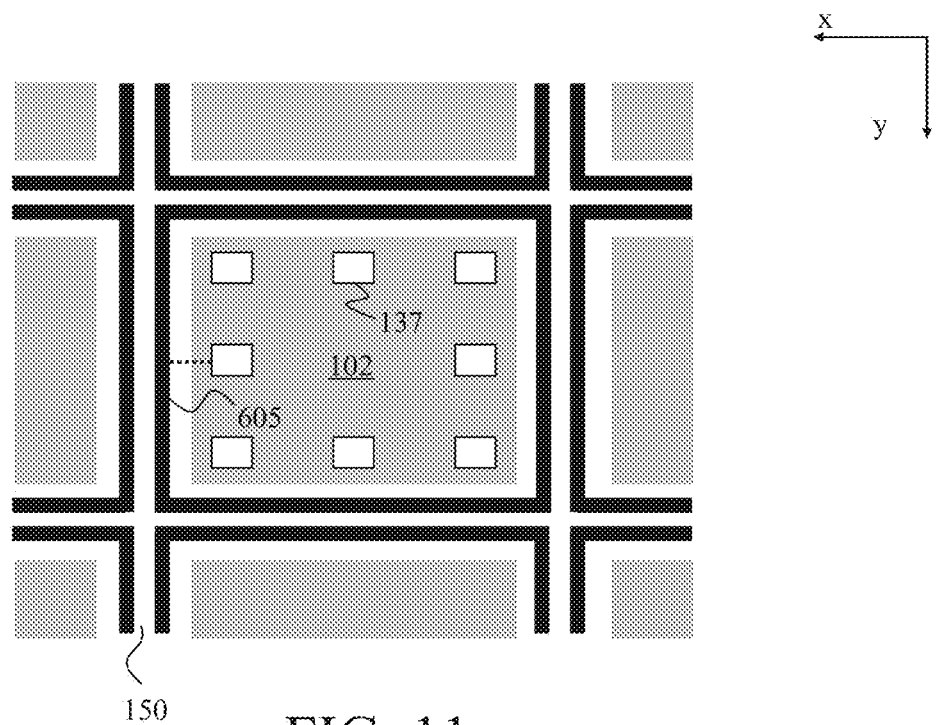

One or more embodiments may be also applied to cases wherein connection lines 605 are located over the wafer 110 surface, but the shielding contact pads 505 are lacking, as illustrated in FIG. 11. In this case, during the test the shielding probes 205 will directly contact the connection lines 605.

Figure 12A:
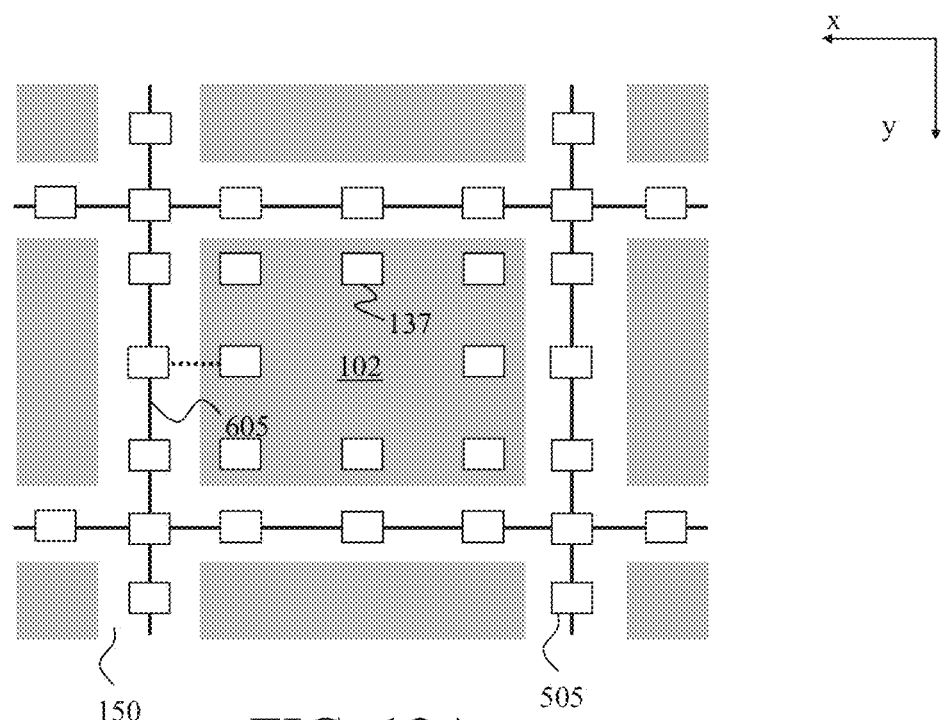
Figure 12B:
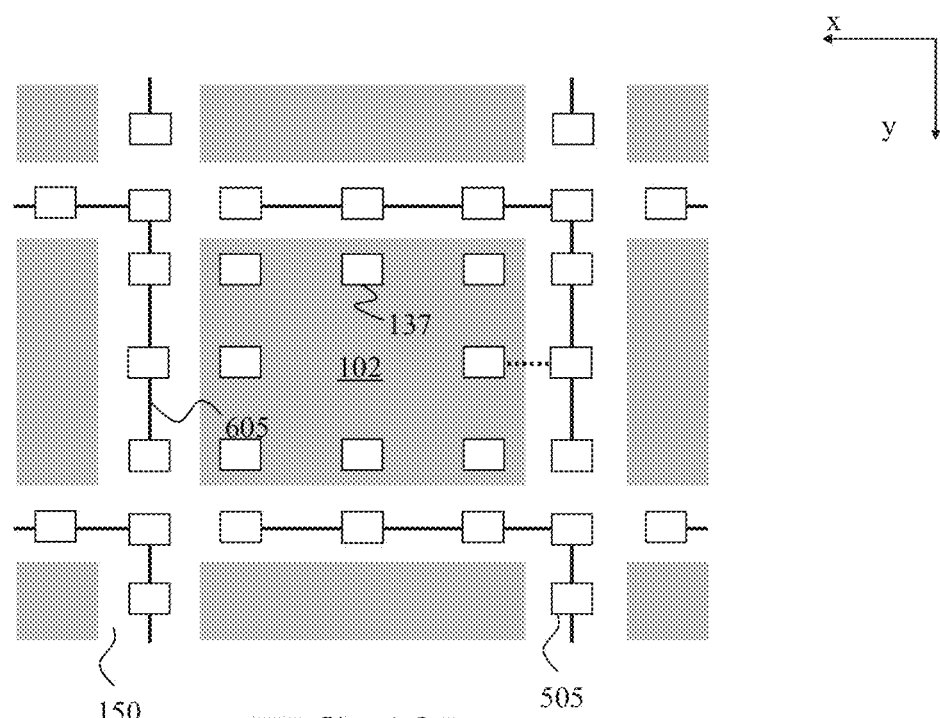

According to a further embodiment, instead of having one connection line 605 per single die 102, a same connection line 605 may be exploited for shielding more dies 102 at the same time. A first example of such an embodiment is illustrated in FIG. 12A, wherein each scribe line 150 is crossed by a single connection line 605, in such a way to form a grid structure; in the same way as previously described, such grid structure may be arranged over the passivation layer covering the scribe lines 150 or under the wafer 110 surface. A further example of such solution is shown in FIG. 12B, wherein each scribe line 150 includes more than one connection line 605, and each connection line 605 is used to shield more than one die 102 at the same time.

In the previously described embodiments, each connection line 605 may be biased by means of a voltage fed by the tester through a probe 135 which is in a communication relationship with a contact pad 137—included in a die 102—connected to the connection line 605 itself. However, the previously described embodiments may be applied to the case in which the connection lines 605 are not connected to any contact pad 137 located within a die 102, and the biasing voltage of the connection line 605 is fed by the tester through at least one of the shielding probes 205 adapted to enter in communication relationship with such connection line 605, as already outlined in reference with FIG. 8B. Such embodiments are valid even if the shielding contact pads 505 are directly formed within the seal ring (not illustrated in figure) of the die 102 instead of being formed in the scribe line 105. In this case, the metallic structure of the seal ring functions as a connection line 605 as well, and thus such ring may be a closed loop or an open loop as in the previously discussed cases.

The embodiments that have been described until now may allow efficiently reducing the crosstalk phenomenon among probes 135 crossed by RF test signals destined to enter in communication relationship with contact pads 137 belonging to different die 102. But the electromagnetic shielding structures obtainable by means of the shielding probes 205 previously described may not allow reducing the crosstalk phenomenon among probes 135 crossed by RF test signals destined to enter in communication relationship with contact pads 137 belonging to the same die 102.

As a consequence, according to an embodiment, each probe 135 adapted to be crossed by RF test signals during the test operations may be surrounded by a corresponding electromagnetic shielding structure adapted to shield the electromagnetic shield irradiated by such probe 135. Particularly, according to an embodiment, such electromagnetic shielding structure may consist of proper shielding probes 205 similar to those previously described.

Figure 13:
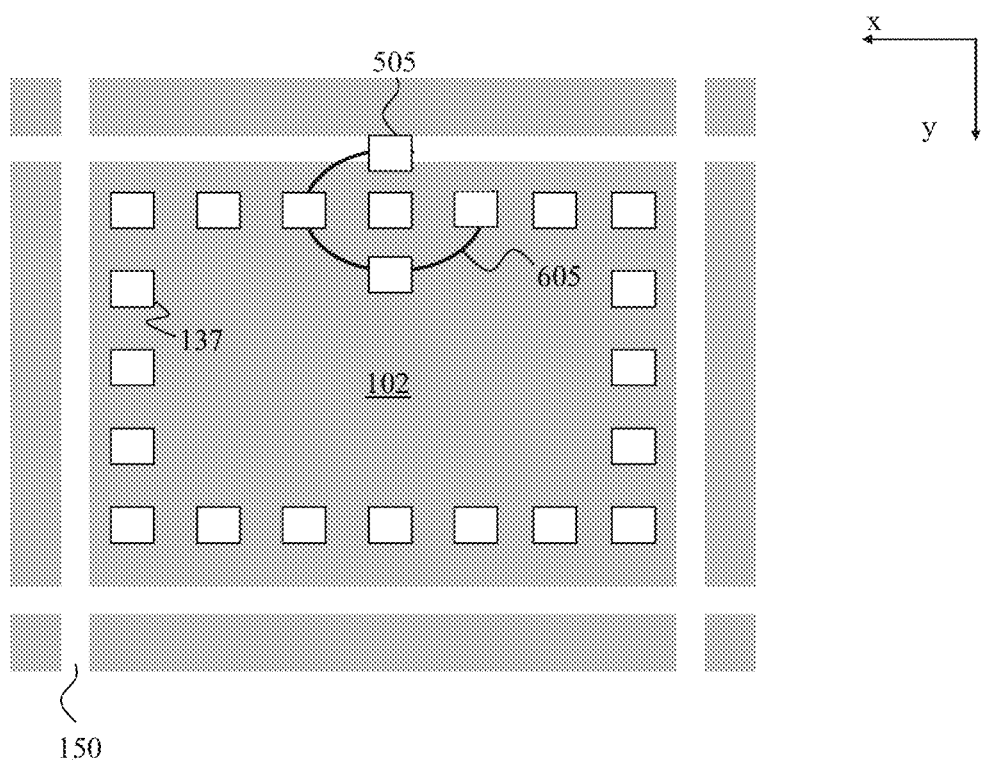

For example, as illustrated in FIG. 13, each probe 135 adapted to be crossed by RF test signals may be surrounded by a connection line 605 connected to shielding contact pads 505; similarly to what has been previously described regarding the whole shielding of a die 102, during the test the shielding contact pads 505 are contacted by the shielding probes 205, properly biased by the tester through the probe card 105 or one of the shielding contact pads 505 connected to the connection line 605. All that has been previously described may be applied to the case of single shielding probe 135, such as for example the presence of shielding contact pads 505 connected to more than one connection line 605, connection lines 605 of the open loop type, connection lines 605 lacking of contact pads 505 adapted to be directly contacted by the shielding probes 505, and so on. Given that by providing an RF test signal to a generic contact pad 137 of a die 102 currents are generated within the circuit integrated therein such to make the voltages of other contact pads 137 of the same die 102 oscillate at the same frequency of the RF signal, which voltages would normally have to be kept constant (such as for example the one of a contact pad 137 adapted to receive the ground voltage), the probes 135 connected to such contact pads as well would be crossed by an RF signal component, and thus they may irradiate in turn an electromagnetic field. As a consequence, according to an embodiment, also the probes 135 destined to enter in communication relationship with such contact pads 137 may be surrounded by electromagnetic shielding structures such as the ones previously described.

After the test operations and after the wafer 110 sorting, some of the previously described structures may be still present on the die 102, and thus they may be advantageously used for assembling the die 102 itself in order to form at least one electromagnetic shield for at least one signal that is received and/or transmitted from/to the die 102 to/from an external electronic system. For example the die 102 may be assembled on a PCB (not shown in any figure) and may be connected thereto by means of conductive protrusions (in jargon, "bumps") located over the contact pads 137 and 505. To this effect, all the considerations previously described for the contact pads 137 and 505 may be applied even if such contact pads are provided with bumps located thereon, which will contact the probes 135 and 205.

According to a further embodiment, the electromagnetic shielding of the single probe 135 may be implemented on the probe card 105 (and particularly on the substrate 130) by means of structures that are different than the previously described shielding probes 205. Particularly, considering a probe card 105 provided with probes 135 of the MEMS type manufactured by means of lithographic techniques, it may be possible to create electromagnetic shielding structures made of conductive material during the same steps of the probes 135 manufacturing process.

Figure 14A:
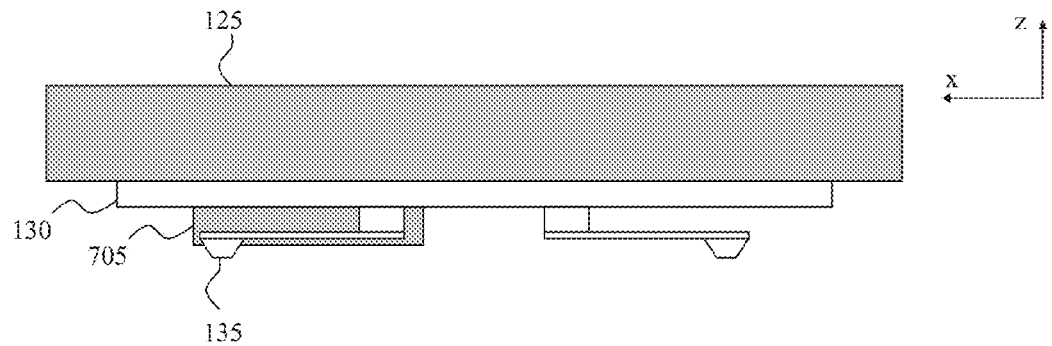
Figure 14B:
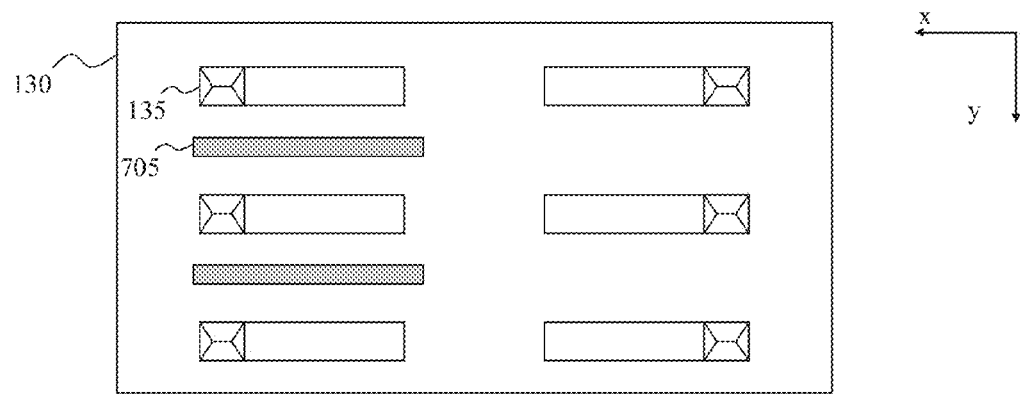

For example, as it is illustrated in the FIGS. 14A and 14B, a wall made of a metallic material, identified with the reference 705, may be provided within the space between two adjacent probes 135, which wall may be directly connected to the lower surface of the substrate 130 from which the probes 135 extends. As can be seen in FIG. 14A, the height of such walls along the z axis—i.e., along the direction that is perpendicular to the surface of the substrate 130 facing the wafer 110 to be tested—is sufficiently extended to allow substantial covering of the whole probe 135 when the latter is in contact relationship with a corresponding contact pad 137 on the die 102 to be tested. At the same time, in order to allow the probe 135 to contact the corresponding contact pad 137 in a correct manner, such extension is sufficiently reduced so as to leave the probe 135 tip to protrude. Like the shielding probes 205, the walls 705 are biased to a constant potential (such as the ground voltage) or to a slowly variable potential, for example through the tester.

Figure 14C:
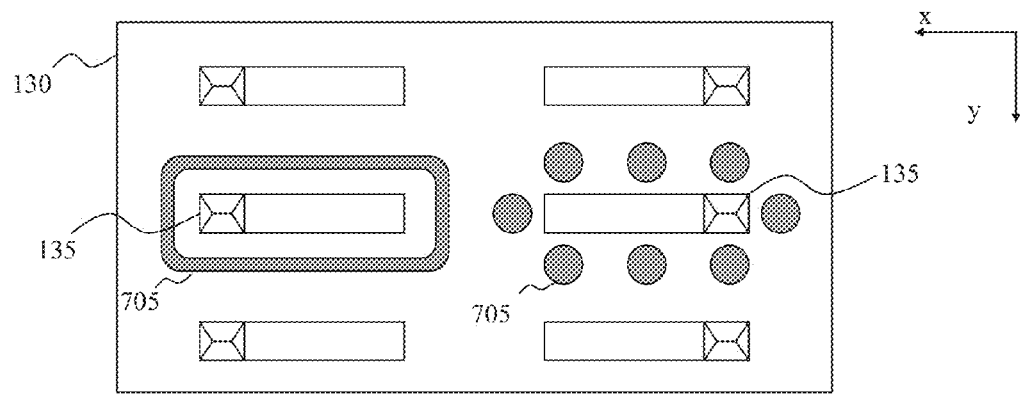

As it is illustrated in FIG. 14C, according to an embodiment the walls 705 may close themselves so as to form a ring entirely surrounding at least one probe 135 (in the figure, on the left); according to an alternative embodiments such ring may be provided with several openings or may be interrupted in several portions (such as for the probe 135 on the right of the figure), or may have a different shape.

Naturally, in order to satisfy local and specific requirements, a person skilled in the art may apply to the above description many modifications and alterations. Particularly, although one or more embodiments of the present invention have been described with a certain degree of particularity, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

The invention claimed is:

1. A probe card comprising:
a first plurality of probes, each probe of said first plurality of probes arranged to contact a corresponding terminal of a first circuit that is integrated in a first die of a semiconductor material wafer during a wafer test phase, said first plurality of probes including at least one probe that provides a radio frequency test signal to or receives a radio frequency test signal from the corresponding terminal of the first circuit during the wafer test phase,
a second plurality of probes, each probe of said second plurality of probes arranged to contact a corresponding terminal of a second circuit that is integrated in a second die of said semiconductor material wafer during the wafer test phase, said second plurality of probes including at least one probe that provides a radio frequency test signal to or receives a radio frequency test signal from the corresponding terminal of the second circuit during the wafer test phase, and
a third plurality of probes forming an electromagnetic shield structure positioned between the first plurality of probes and the second plurality of probes and within a scribe line located between the first die and the second die of said semiconductor material wafer, electromagnetic shield structure at least partially shielding the second plurality of probes from an electromagnetic field irradiated by said at least one probe of the first plurality of probes and at least partially shielding the first plurality of probes from an electromagnetic field irradiated by said at least one probe of the second plurality of probes.

2. The probe card according to claim 1, wherein the first, second and third pluralities of probes are connected to the probe card by means of a supporting element configured in such a way that the probes face a wafer surface during the wafer test phase and extend downwardly from the supporting element toward the wafer surface.

3. The probe card of claim 1, further comprising means for biasing the third plurality of probes with a shielding voltage potential.

4. The probe card of claim 3, said shielding voltage potential having a constant value.

5. The probe card of claim 3, said shielding voltage potential having a value that varies at a frequency that is substantially lower than a frequency of the radio frequency test signal.

6. The probe card of claim 1, wherein the third plurality of probes are arranged to completely surround said first die.

7. The probe card of claim 1, wherein the third plurality of probes are configured to contact a surface of the scribe line during the wafer test phase.

8. The probe card of claim 1, wherein:
said scribe line includes shielding contact pads, and
the third plurality of probes is configured to contact the shielding contact pads during the wafer test phase.

9. The probe card of claim 8, further comprising conductive connection lines interconnecting the shielding contact pads within the scribe line.

10. The probe card of claim 8, wherein the shielding contact pads are divided in groups, and further comprising conductive connection lines for interconnecting the shielding contact pads of each group.

11. The probe card of claim 3, wherein the probe card is configured to be coupled with a tester that communicates the test signals during the wafer test phase and includes said means for biasing to provide said shielding voltage potential.

12. The probe card of claim 2, wherein:
the first and second pluralities of probes extend downwardly from the supporting element by a first distance; and
the third plurality of probes extend downwardly from the supporting element by a second distance that is less than the first distance.

13. The probe card of claim 2, further comprising:
an rf-signal node disposed on the supporting element and configured to supply the radio frequency test signal;
a bias-signal node disposed on the support element and configured to supply a reference bias voltage to the third plurality of probes.

14. A probe card comprising:
a first plurality of probes, each probe of said first plurality of probes arranged to contact a corresponding terminal of a first circuit that is integrated in a first die of a semiconductor material wafer during a wafer test phase, said first plurality of probes including at least one probe that provides a radio frequency test signal to or receives a radio frequency test signal from the corresponding terminal of the first circuit during the wafer test phase,
a second plurality of probes, each probe of said second plurality of probes arranged to contact a corresponding terminal of a second circuit that is integrated in a second die of said semiconductor material wafer during the wafer test phase, and
a third plurality of probes forming an electromagnetic shield structure positioned between the first plurality of probes and the second plurality of probes and within a scribe line located between the first die and the second die of said semiconductor material wafer, the electromagnetic shield structure at least partially shielding the second plurality of probes from an electromagnetic field irradiated by said at least one probe of the first plurality of probes.

15. The probe card according to claim 14, wherein the first, second and third pluralities of probes are connected to the probe card by means of a supporting element configured in such a way that the probes face a wafer surface during the wafer test phase and extend downwardly from the supporting element toward the wafer surface.

16. The probe card of claim 15, wherein:
the first and second pluralities of probes extend downwardly from the supporting element by a first distance; and
the third plurality of probes extend downwardly from the supporting element by a second distance that is less than the first distance.

17. The probe card of claim 15, further comprising:
an rf-signal node disposed on the supporting element and configured to supply the radio frequency test signal;
a bias-signal node disposed on the support element and configured to supply a reference bias voltage to the third plurality of probes.

18. The probe card of claim 14, further comprising means for biasing the third plurality of probes with a shielding voltage potential.

19. The probe card of claim 18, said shielding voltage potential having a constant value.

20. The probe card of claim 18, said shielding voltage potential having a value that varies at a frequency that is substantially lower than a frequency of the radio frequency test signal.

21. The probe card of claim 18, wherein the probe card is configured to be coupled with a tester that communicates the test signals during the wafer test phase and includes said means for biasing to provide said shielding voltage potential.

22. The probe card of claim 14, wherein the third plurality of probes are arranged to completely surround said first die.

23. The probe card of claim 14, wherein the third plurality of probes are configured to contact a surface of the scribe line during the wafer test phase.

24. The probe card of claim 14, wherein:
    said scribe line includes shielding contact pads, and
    the third plurality of probes is configured to contact the shielding contact pads during the wafer test phase.

25. The probe card of claim 24, further comprising conductive connection lines interconnecting the shielding contact pads within the scribe line.

26. The probe card of claim 24, wherein the shielding contact pads are divided in groups, and further comprising conductive connection lines for interconnecting the shielding contact pads of each group.

\* \* \* \* \*